(12) United States Patent
Kutsche et al.

(10) Patent No.: US 11,096,310 B2
(45) Date of Patent: Aug. 17, 2021

(54) SUPPORT RAIL FASTENING MEANS

(71) Applicant: Eaton Intelligent Power Limited, Dublin (IE)

(72) Inventors: Wolfgang Kutsche, Weilerswist (DE); Julia Otte, Cologne (DE); Oliver Knoerrchen, Cologne (DE)

(73) Assignee: EATON INTELLIGENT POWER LTD., Dublin (IE)

( * ) Notice: Subject to any disclaimer, the term of this patent is extended or adjusted under 35 U.S.C. 154(b) by 40 days.

(21) Appl. No.: 16/622,308

(22) PCT Filed: Jun. 6, 2018

(86) PCT No.: PCT/EP2018/064822
§ 371 (c)(1),
(2) Date: Apr. 28, 2020

(87) PCT Pub. No.: WO2018/228877
PCT Pub. Date: Dec. 20, 2018

(65) Prior Publication Data
US 2021/0153377 A1    May 20, 2021

(30) Foreign Application Priority Data
Jun. 14, 2017   (DE) ................... 10 2017 113 063.2

(51) Int. Cl.
*F16M 13/00*   (2006.01)
*H05K 7/18*    (2006.01)
*F16M 13/02*   (2006.01)

(52) U.S. Cl.
CPC .......... *H05K 7/183* (2013.01); *F16M 13/022* (2013.01)

(58) Field of Classification Search
CPC .. F16M 13/022; F16M 2200/00; F16M 13/02; F16B 2/20; E04B 9/006; E04B 2/24
See application file for complete search history.

(56) References Cited

U.S. PATENT DOCUMENTS 3,696,935 A * 10/1972 Dean ................... A44B 11/25
211/41.12
3,897,885 A *  8/1975 Joyce ................. G11B 23/0236
220/351

(Continued)

FOREIGN PATENT DOCUMENTS

DE        29506579 U1   6/1995
DE        29804153 U1   7/1999

(Continued)

*Primary Examiner* — Amy J. Sterling
(74) *Attorney, Agent, or Firm* — Leydig, Voit & Mayer, Ltd.

(57) ABSTRACT

A support rail fastener for detachably fastening a component to a support rail includes: a mounting plate, the mounting plate having at least one attachment element and a guide; a first spring element; and a slider, the slider being displaceable on the guide, the first spring element being brought into a preloaded position by moving the slider on the guide. On the guide and on the slide latching elements are respectively provided which, when the first spring element is preloaded the latching elements are brought into engagement with each other such that the slider engages in a latching position. The support rail fastener in an initial position in which the slider is in the latching position and in which the mounting plate is placed on the support rail by the attachment element is movable along the support rail.

13 Claims, 5 Drawing Sheets

(56) References Cited

U.S. PATENT DOCUMENTS 4,165,852 A * 8/1979 Chervenak ............ A47B 95/008
          108/152
4,648,514 A * 3/1987 Niles ..................... A47G 29/08
          211/41.12

FOREIGN PATENT DOCUMENTS

DE        102010046620 A1    3/2012
EP             0780939 A1    6/1997

* cited by examiner

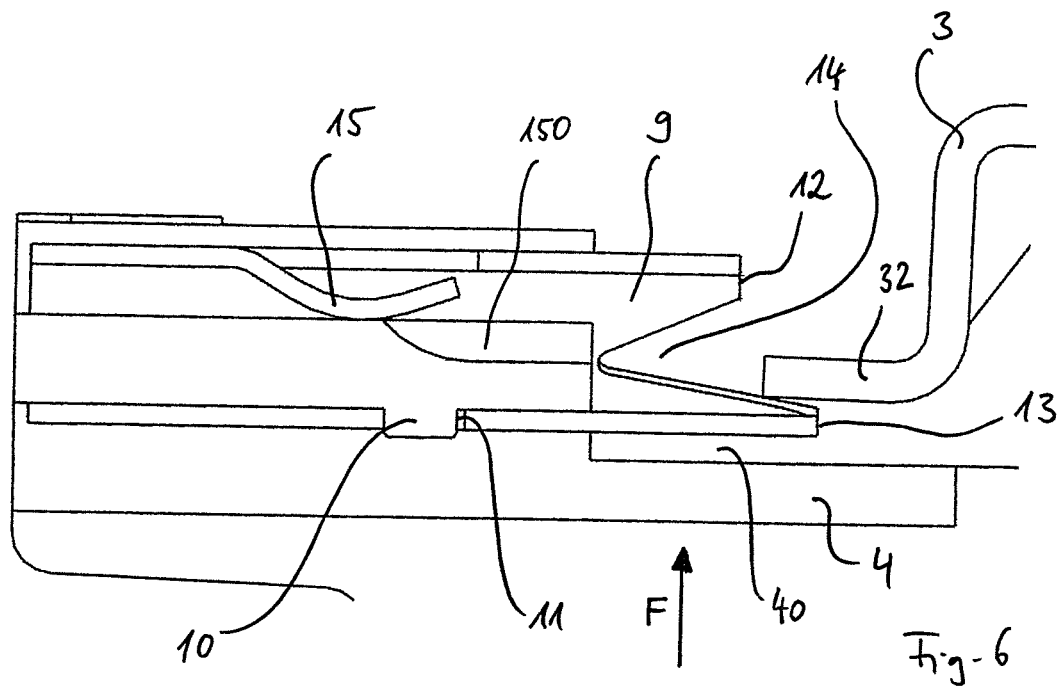
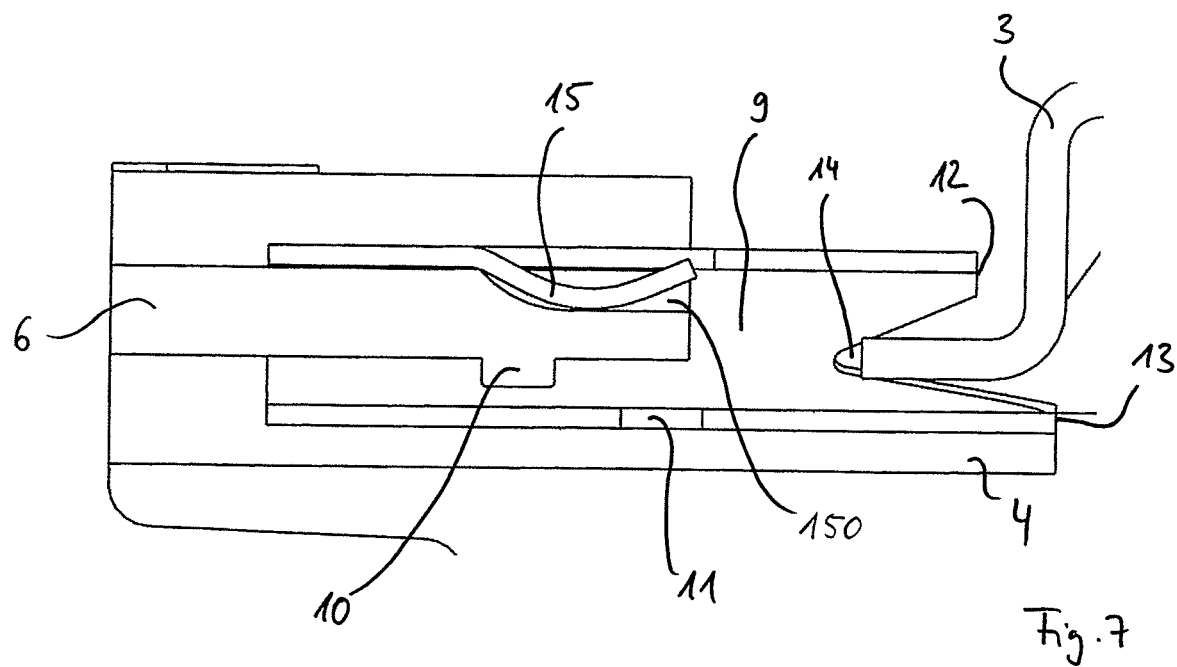

SUPPORT RAIL FASTENING MEANS

CROSS-REFERENCE TO PRIOR APPLICATIONS

This application is a U.S. National Phase application under 35 U.S.C. § 371 of International Application No. PCT/EP2018/064822, filed on Jun. 6, 2018, and claims benefit to German Patent Application No. DE 10 2017 113 063.2, filed on Jun. 14, 2017. The International Application was published in German on Dec. 20, 2018 as WO 2018/228877 under PCT Article 21(2).

FIELD

The present invention relates to a support rail fastening means for detachably fastening a component to a support rail.

BACKGROUND

"Support rails" refers to profile rails which are used primarily in electrical engineering for fastening components, such as contactors, motor circuit-breakers, power circuit breakers and the like, in distribution boxes, control cabinets and the like. Support rails are generally made of metal, preferably of steel, copper or aluminum. Various standardized support rail types are summarized in DIN EN 60715.

DIN rails are support rails with a substantially U-shaped, hat-shaped profile. The mounting of electrical components on support rails, in particular on DIN rails, is generally effected by hooking behind an edge of the support rail an attachment element formed on the housing of the component to be fastened and then engaging a movable fastening element behind a second edge of the support rail.

A corresponding fastening device for fastening an electrical device to a support rail is known from DE 298 04 153 U1. A device is described there that comprises a base plate, a slider under spring pressure as a movable fastening element and also a latching projection, wherein the slider is provided with clamping slopes for clamping to the support rail and the support rail edge can be clamped between two side legs of the slider. The slider is designed as a separate part and is supported in the insertion position via an intermediate spring on a guide block formed on the base plate. The fastening of the electrical device to the support rail requires the fitter to directly manipulate the slider, in that the latter is first deflected by hand against the force of the spring element and then springs back by the force of the spring element, the side legs of the slider thereby being clamped against the support rail. Correspondingly, the slider must also be operated by hand in order to dismount the device and deflected again against the force of the spring until the previously clamped support rail edge is released again. Since the slider is arranged on the rear side of the electrical component facing the support rail and thus in a position in the control cabinet which is generally difficult to access, it is a disadvantage of such devices that the fitter must manipulate the slider directly in order to mount and dismount the electrical component, in particular when many electrical components are mounted in a control cabinet in a tight space.

A further support rail fastening means is known from DE 10 2010 046 620 A1, which discloses a latching projection formed on a housing of the component to be fastened and a movably mounted slider interacting therewith. Here, the slider can be placed onto a guide strip formed on the housing and can be longitudinally displaced along the same, wherein an intermediate spring element can be brought into a pre-loaded position by the longitudinal displacement. The slider further has a latching lug which, when the spring element is preloaded, can engage in a stop recess so that a further longitudinal displacement of the slider is prevented. In the case of a slider pre-mounted in this way, in order to mount the component, the latching projection is hooked onto the support rail and the component is then pressed against the support rail, as a result of which the slider slides on the lower edge of the support rail while being minimally pressed rearwardly against the force of the spring element, thereupon latching behind the lower edge of the support rail. The latching lug formed on the slider remains latched in the stop recess during this mounting process. In order to dismount the component, it is necessary to pull the slider rearwardly against the force action of the spring element by means of a tool. This pulls an engagement edge of the slider away from the edge of the support rail and makes it possible to remove the component from the support rail.

Although the fastening means described in DE 10 2010 046 620 A1 enables mounting in which it is not necessary to manipulate the slider directly but only the component itself, the component can nevertheless only be dismounted by manipulating the slider directly. In addition, the use of a tool is required for this purpose. Finally, the fastening means described does not provide a firm seating of the component on the support rail since the slider only engages behind the support rail edge with its engagement edge, but without coming into contact here in a clamping manner. Although the component can thus not easily be removed in a forward direction from the support rail, a displacement along the support rail is however still possible due to the insufficient clamping effect.

However, for many applications, it is necessary for the mounted components to be fastened without slippage even when there are strong lateral displacement forces, such as are caused, for example, by shock, shaking and vibrational loads. In this case, it is known from the prior art to attach so-called end caps to the support rail on the right and left of the component that is to be fastened in order to prevent the component from shifting or slipping on the support rail. However, such a solution is disadvantageous not only as regards the installation effort but also as regards an optimized utilization of the space available in the control cabinet.

The support rail fastening means mentioned are designed in such a way that the component to be fastened is initially held loosely on the support rail by hooking an attachment element behind an edge of the support rail. In this position, the component can be aligned with regard to its final mounting position before it is fixed in the selected position by the movable fastening element then latching behind the second edge of the support rail. Such a possibility of aligning and moving before final fixing is essential for certain applications, for example when the component is to be coupled via corresponding coupling elements to control elements in the user-side control cabinet door.

SUMMARY

In an embodiment, the present invention provides a support rail fastener for detachably fastening a component to a support rail, comprising: a mounting plate, the mounting plate having at least one attachment element and a guide; a first spring element; and a slider, the slider being displaceable on the guide, the first spring element being configured to be brought into a preloaded position by moving the slider on the guide, wherein on the guide and on the slide latching elements are respectively provided which, when the first spring element is preloaded the latching elements are configured to be brought into engagement with each other such that the slider engages in a latching position, wherein the support rail fastener in an initial position in which the slider is in the latching position and in which the mounting plate is placed on the support rail by the attachment element is movable along the support rail, wherein the slider has a first edge and a second edge at a distance therefrom, and a clamping groove formed between the first edge and the second edge, wherein starting from the initial position, a triggering movement of the slider is induceable by application of a force to the mounting plate in a direction of the support rail, as a result of which triggering movement the engagement between the latching elements is released and the slider is configured to be brought by the restoring force of the first spring element from the latching position into a locking position in which the slider in a region of the clamping groove comes into clamping contact with the support rail and the support rail fastener is fixed in a locking position on the support rail, wherein the triggering movement comprises a tilting movement of the slider, wherein the second edge of the slider in the initial position comes into contact with the support rail such that the force applied to the mounting plate in the direction of the support rail is transferred via the second edge to the slider such that the slider makes a tilting movement, wherein the slider, staring from the locking position of the support rail fastener, is transferrable form the locking position back into the latching position by a movement of the mounting plate in a direction which enables the attachment element to be lifted off the support rail, and wherein the support rail fastener is configured to be brought back into the initial position in this way.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following:

FIG. 6: the support rail fastening means according to the invention with the slider in the latching position in a sectional view;

FIG. 7: the support rail fastening means according to the invention with the slider in the locking position in a sectional view;

DETAILED DESCRIPTION

Figure 1:
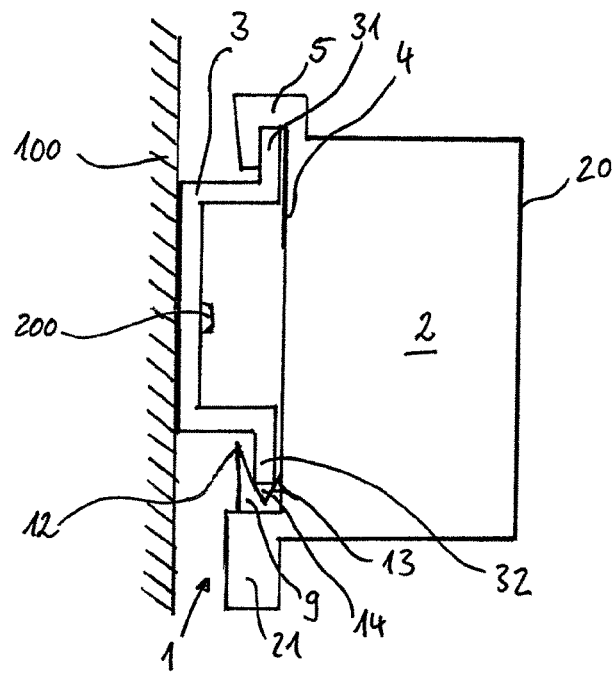
FIG. 1: in a schematic side view, a component fastened onto a support rail by means of a support rail fastening means according to the invention.

In an embodiment, the present invention provides a support rail fastening means for the comfortable tool-free mounting and dismounting of a component to be fastened, by means of which not only an alignment of the component to be fastened on the support rail is made possible but also a fixed seating of the component mounted on the support rail.

In an embodiment, the present invention provides a support rail fastening means for detachably fastening a component to a support rail, comprising a mounting plate, wherein the mounting plate has at least one attachment element and also a guide, a first spring element, and also a slider, wherein the slider is slidable on the guide and the first spring element can be brought into a preloaded position by the sliding the slider on the guide and wherein latching elements are provided in each case on the guide and on the slider, which latching elements can be brought into engagement with each other when the first spring element is preloaded in such a way that the slider is latched in a latching position, wherein the support rail fastening means in an initial position, in which the slider is in the latching position and in which the mounting plate by means of the attachment element is placed onto the support rail, can be moved along the support rail, wherein the slider has a first edge and a second edge spaced apart therefrom and a clamping groove formed between the first edge and the second edge, and wherein starting from the initial position a release movement of the slider can be triggered by application of force to the mounting plate in the direction of the support rail, through which release movement the engagement between the latching elements is released and the slider by means of the restoring force of the first spring element can be brought from the latching position into a locking position in which the slider is clamped to the support rail in the region of the clamping groove and the support rail fastening means is fixed in a locking position to the support rail.

In other words, the invention is characterized in that a triggering movement of the slider, by means of which the engagement between the latching elements is released, can be induced by a force acting on the mounting plate in the direction of the support rail. Due to the restoring force of the first spring element, the slider then moves rapidly from the latching position and along the guide to the edge of the support rail until it comes to rest in a clamping manner against the latter in the region of its clamping groove, as a result of which the support rail fastening means is fixed to the support rail.

In contrast to known solutions, the slider for fixing the support rail fastening means is thus not only deflected minimally out of an initial position against the restoring force of the first spring element in order to engage behind the edge of the support rail and then to move back along the deflection path into the initial position, but also due to the force acting on the mounting plate the latching between the guide and slider is fully released so that the slider can be moved by the restoring force of the first spring element from a first stable position into a second stable position in which it is clamped in the region of its clamping groove against the support rail edge. In this case, the clamping effect is brought about by the first spring element still being located in a partially preloaded position even in the locking position of the slider. The still remaining restoring force of the first spring element thus presses the slider in the region of its clamping groove against the support rail. In this way, the support rail fastening means is fixed to the support rail, with "fixing" in the sense of the invention being understood to mean that the support rail fastening means in the locking position can neither be easily detached in a forward direction from the support rail nor be slid along the support rail without a greater exertion of force. Mounting end caps to limit lateral movement can thus be dispensed with.

The support rail fastening means according to the invention is further characterized in that it can be comfortably mounted without tools. For this purpose, the slider is first brought into the latching position and the support rail fastening means is placed onto the support rail with the aid of the attachment element. The support rail fastening means now hangs on the support rail by virtue of its own weight. In this initial position, the support rail fastening means is already held loosely on the support rail, but it is still movable along the support rail and can thus be aligned with regard to its final mounting position. For final fixing, only an application of force to the mounting plate in the direction of the support rail is required. A fitter therefore only needs to press the mounting plate against the support rail. According to the invention, this force application induces a triggering movement of the slider, by means of which the latching between slider and guide is released and the slider can be moved into a second stable position in the manner described above. Thus, neither manipulating the slider directly is necessary nor is it required to use a special tool.

The mounting plate can be designed in different ways. For example, the mounting plate can take the form of a separate component or be an integral part of the component to be fastened. According to one embodiment of the invention, the mounting plate can form a wall of a housing for receiving the component to be fastened. A force acting on the mounting plate is in this case be effected by an application of force to the entire housing in a direction toward the support rail. Alternatively, the mounting plate can also take the form of an adapter plate on which a component to be fastened is mounted beforehand with or without a housing. In this case, the force acting on the mounting plate is caused by a force acting on the component to be fastened in a direction toward the support rail.

According to one embodiment of the invention, the triggering movement is a tilting movement of the slider, wherein the second edge of the slider in the initial position contacts the support rail in such a way that the force acting on the mounting plate in the direction of the support rail is transmitted via the second edge to the slider in such a way that the latter performs a tilting movement. Here the slider is preferably designed in such a way that the second edge of the slider projects beyond the first edge, which is explained below. As a result of such a tilting movement, which can also be regarded as a rotational movement with a small angle of rotation about an axis of rotation running parallel to the longitudinal extension of the support rail, the engagement between the latching elements is released and the slider moves from the latching position into the locking position by means of the restoring force of the first spring element.

According to one embodiment of the invention, the first spring element can be formed integrally with the slider, for example be formed directly thereon. Here, the first spring element can be designed as any spring element which can be brought into a preloaded position by displacement of the slider on the guide.

In an alternative embodiment of the invention, the first spring element and the slider can also be designed as two separate parts. In this case, the guide preferably comprises a receptacle in which the first spring element can be arranged. Not only in a one-part but also in a two-part design of slider and first spring element, the first spring element can take the form of a helical spring, for example.

Fine tuning of the fastening mechanism can be effected via the particular selection of the first spring element, in particular of its dimensions and its spring constant. The selection of the first spring element can be used to control the force action by means of which the slider moves from the latching position into the locking position, and the strength of the clamping action of the slider on the support rail in the locking position can also be set via the selection of the first spring element.

It can be provided that a stop is formed on the mounting plate and limits the movement of the slider during the transition from the latching position into the locking position. Such a stop is in this case preferably arranged in such a way that it does not prevent the slider from coming with its clamping groove into clamping contact with the support rail.

In one exemplary embodiment of the invention, the latching elements on the guide are designed as latching lugs and the latching elements on the slider are designed as corresponding recesses into which the latching lugs engage in the latching position.

In an alternative embodiment of the invention, the latching elements on the guide take the form of elongated holes and the latching elements on the slider take the form of latching hooks which engage in the elongated holes in the latching position. Such an embodiment of the latching elements may have manufacturing advantages.

In principle, any other embodiments of the latching elements are conceivable beyond the embodiments mentioned as long as in the latching position there is a latching between guide and slider which can be released by the triggering movement of the slider.

According to one proposal of the invention, the slider comprises at least one second spring element, wherein the triggering movement of the slider can be induced by a force acting on the mounting plate in the direction of the support rail and against the force of the at least one second spring element. By the use of at least one second spring element and by the specific selection of this spring element, in particular due to its spring constant, the force application required for the triggering movement can be controlled. In this way, it is possible, through the selection of the at least one second spring element, to specify a certain threshold value for the force action so that the slider is not already inadvertently triggered as a result of a slight contact with the support rail during the initial mounting of the support rail fastening means. A minimum force dependent on the spring force of the at least one second spring element must be provided so that the slider triggers and transitions from the latching position into the locking position.

It can be provided that the slider comprises two second spring elements. These can preferably be arranged symmetrically with respect to a central axis of the slider. In this case, the triggering movement of the slider is triggered by a force acting on the mounting plate against the force of the two second spring elements.

In principle, the at least one second spring element can be formed in one piece with the slider, which simplifies manufacture and results in a greater stability of the slider and spring element assembly. In particular, the slider, the first spring element and the at least one second spring element can thus be formed in one piece.

The slider can preferably be made of a spring steel. Spring steel not only offers the strength required for the intended application but also elasticity of the material. In principle, however, other suitable materials are also conceivable. For example, the slider can also be made of a suitable plastic. The first spring element, the at least one second spring element and the slider can in this case be made from the same or from different materials; in particular, the first spring element and/or the at least one second spring element can also be made from a spring steel or from a plastic.

One embodiment of the invention provides that the at least one second spring element takes the form of a leaf spring. In an embodiment with two second spring elements, both second spring elements can take the form of identical leaf springs.

The guide can comprise two guide rails which can form a receptacle for the first spring element between them. The two guide rails preferably run in parallel to one another and each comprises a latching element, which can, for example, take the form of a latching lug or an elongated hole. In this case, the slider has a sled-like design so that it engages around the two guide rails in the operating position and can be displaced thereon. Latching elements, for example recesses or projections, are formed on the slider and can interact with the latching elements formed on the guide rails in the manner already described above so that the slider can engage in a latching position when the first spring element is preloaded.

In order to bring the latter into a preloaded position by sliding the slider when the first spring element is formed separately, a catch element can be formed on the slider, which in the operating position comes to rest against one end of the first spring element arranged in the receptacle and compresses it when the slider is displaced along the guide and thus puts it into a preloaded position. In this case, the spring element can be supported with its second end on a boundary wall of the receptacle in which it is arranged. In order to bring the slider into the latching position, the slider is displaced along the guide until the latching elements formed on the guide and on the slider latch with each other so that the slider assumes a first stable position when the first spring element is preloaded. As already described above, the slider can be released from this latching position and be transferred into the second stable position, the locking position.

In order to release the component fastened with the aid of the support rail fastening means according to the invention from the support rail again, it is proposed according to a proposal of the invention that the slider can be transferred, starting from the locking position of the support rail fastening means, from the locking position back into the latching position by means of a movement of the mounting plate in a direction which enables the attachment element to be lifted off the support rail, and the support rail fastening means can in this way be moved back into the initial position. In other words, a component to be fastened can not only be mounted without tools but can also be dismounted again without tools by a user gripping the mounting plate or the component and moving it in a direction which enables the attachment element to be lifted off the support rail, i.e., in general in a vertically upward direction. This movement results in a relative movement between the slider, which is still resting with its clamping groove on the support rail, and the guide, which is connected to the mounting plate, against the restoring force of the first spring element. The latter is compressed more strongly again, namely up to the point at which the latching elements of the slider and guide latch with each other again. Once the latching elements are once again in mutual engagement, the slider is back in its first stable position, the latching position. The support rail fastening means or the component connected thereto can now simply be removed from the support rail or moved to another location on the support rail, where it can be fixed again by a force acting on the mounting plate in the manner already described above.

The support rail fastening means according to the invention is thus characterized in that mounting and dismounting of a component can be effected without tools and a fitter does not need to awkwardly manipulate the slider at the rear in order to lock or release the component. Instead, the component can be comfortably grasped from the front for either process so that mounting and dismounting can be carried out comfortably even under restricted space conditions. The support rail fastening means according to the invention is lastly also characterized in that, due to the two stable positions which the slider can assume, it not only delivers good alignability of the component to be fastened in the latching position of the slider but also particularly good fixing on the support rail in the locking position.

According to another embodiment of the invention, the slider includes an opening for the insertion of a tool. Although it is particularly advantageous according to the invention that the support rail fastening means can be released from the support rail without tools in the manner described above, the slider can alternatively or additionally also be moved from the locking position back into the latching position by inserting a tool, for example a screwdriver, into the opening provided for this purpose.

FIG. 1 shows a schematic side view of a component 2 fastened onto a support rail 3 by means of a support rail fastening means 1. The support rail 3 takes the form of a DIN rail and is fastened by means of fastening means 200 to a wall 100, for example to a wall 100 of a control cabinet. The component 2, for example a contactor switch, is arranged in a housing 20.

A mounting plate 4 forms a wall of the housing 20, namely the wall facing the support rail 3. The mounting plate 4 has two hook-shaped attachment elements 5 of which only one attachment element 5 is visible in the illustration in FIG. 1. By means of the attachment elements 5, the component 2 can be placed onto the support rail 3 or attached thereto in the housing 20. For this purpose, the attachment elements 5 engage around the upper free edge 31 of the DIN rail, as shown in FIG. 1. A slider 9 interacts with the mounting plate 4, which is explained in more detail below. With the aid of the slider 9, the housing 20 of the component 2 can be fixed to the DIN rail. For this purpose, the slider 9 comprises a first edge 12 and a second edge 13 which is spaced apart therefrom and a clamping groove 14 formed between the first edge 12 and the second edge 13. In a locking position of the slider 9 shown in FIG. 1, the slider comes to rest in the region of its clamping groove 14 in a clamping manner on the lower free edge 32 of the support rail 3, as a result of which the support rail fastening means 1 is fixed to the support rail 3.

The slider 9 cooperates with a guide 6 which is formed on the mounting plate 4 and which lies behind the housing section 21 in the illustration of FIG. 1 and is therefore not visible in this illustration. However, the guide 6 can be seen in FIG. 2 in which the housing 20 is shown with a mounting plate 4 facing upward. The guide 6 comprises two guide rails 61, 62 which form a receptacle 7 for a first spring element 8 between them. The first spring element 8, which takes the form of a helical spring, is not shown in FIG. 2 for the sake of clarity. However, the arrangement of the spring element 8 in the receptacle 7 can be seen in the illustration of FIG. 8. The spring element 8 is loosely inserted into the receptacle 7 and can be supported on a boundary wall 71 of the receptacle 7.

Figure 2:
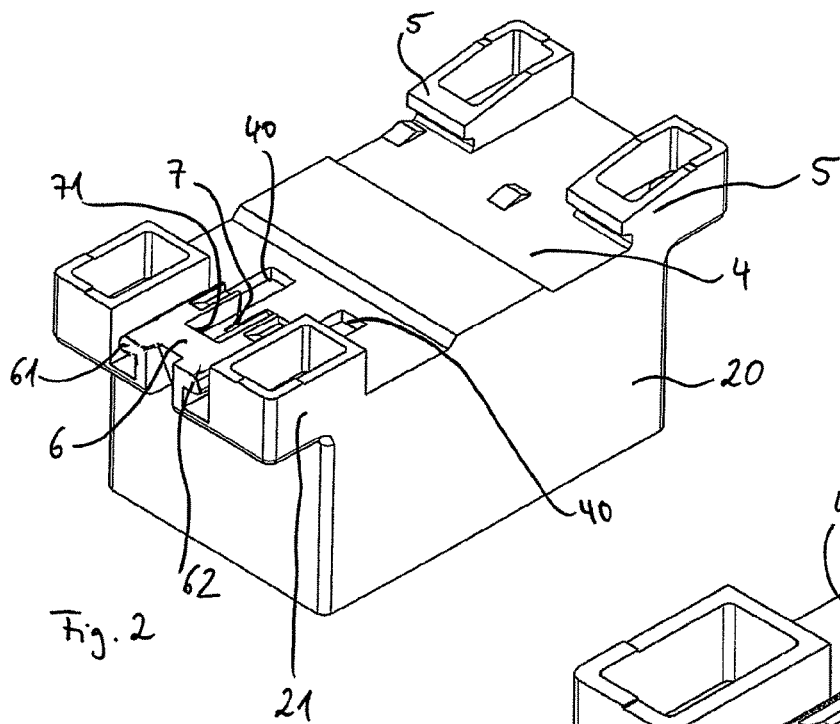
FIG. 2: in a perspective view, a mounting plate taking the form of a wall of a housing of a support rail fastening means according to the invention.
Figure 3:
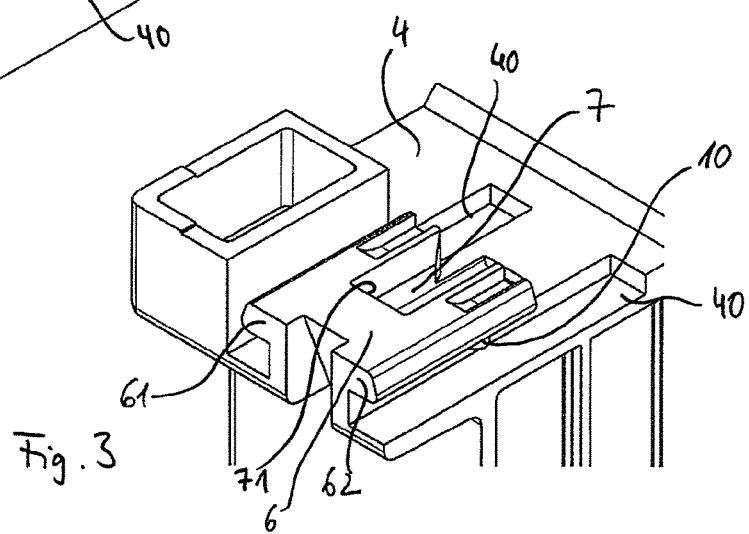
FIG. 3: a section from FIG. 2 in an enlarged view.

FIG. 3 shows a detail of FIG. 2 in an enlarged view, in which the housing section 21 was additionally removed in order to give a view of the guide 6. In this illustration, a latching element taking the form of a projecting latching lug 10 on the underside of the guide rail 62 can be seen. An identical latching lug 10 is formed at the same point on the guide rail 61, which, however, cannot be seen in the illustration of FIG. 3. The function of these latching lugs is explained in more detail below in connection with the slider 9.

Figure 4:
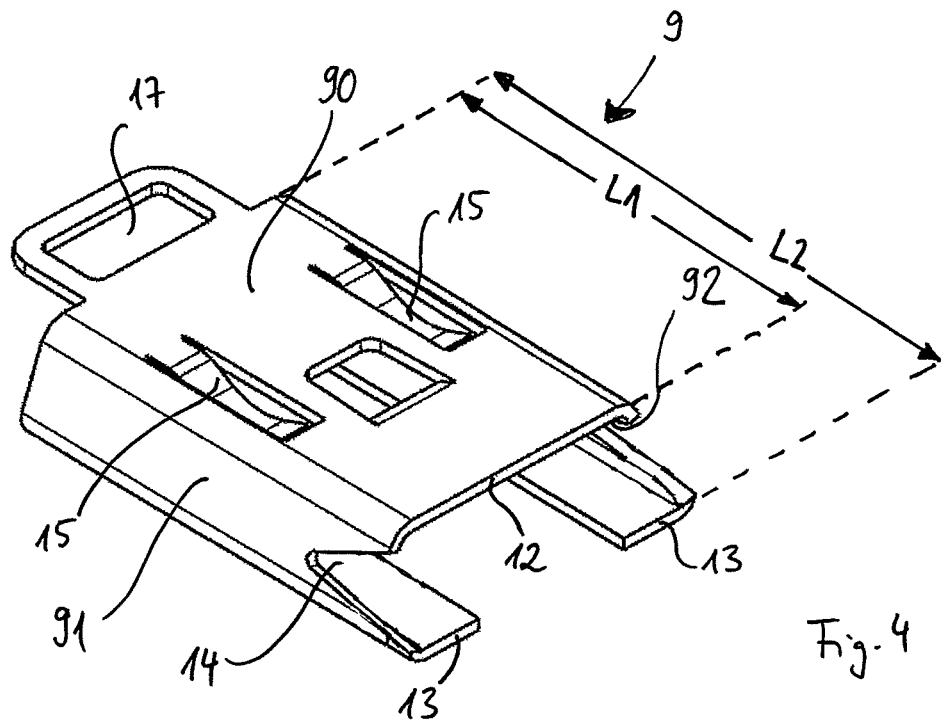
FIG. 4: a first exemplary embodiment of a slider of a support rail fastening means according to the invention in a perspective view from above.

The slider 9 is shown in a view from above and from below in FIGS. 4 and 5 respectively. The slider 9 is of a sled-shaped design and has a base section 90 and two side legs 91, 92 integrally formed thereon. In cross-section, the slider 9 is substantially trapezoidal; that is to say, the side legs 91, 92 each enclose an angle of slightly more than 90° with the base section 90. The base section 90 has a first edge 12, while the side legs 91, 92 have a second edge 13. In this case, the side legs 91, 92 project with the second edge 13 beyond the first edge 12 of the base section 90 so that the length L2 shown in FIG. 4 is greater than the length L1. A clamping groove 14 is formed between the first edge 12 and the second edge 13. In the region of the base section 90, two second spring elements 15 taking the form of leaf springs are embedded in the slider 9. At its end facing away from the edges 12 and 13, the slider 9 includes an opening 17 for the insertion of a tool.

Figure 5:
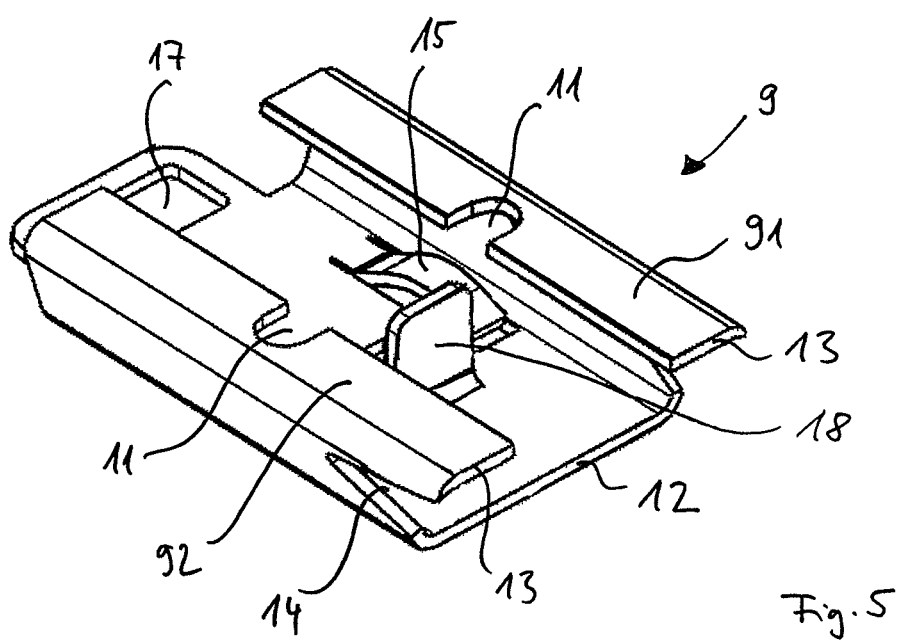
FIG. 5: the slider from FIG. 4 in a perspective view from below.

FIG. 5 shows two recesses 11 which are formed on the underside of the side legs 91, 92 and which are suitable for interacting with the latching lugs 10 formed on the guide rails 61, 62. In particular, the latching lugs 10 can be brought into engagement with the recess 11 in such a way that the slider 9 latches on the guide 6 in a latching position, which is explained in more detail below.

For mounting the support rail fastening means, the first spring element 8 is first inserted into the receptacle 7 between the guide rails 61, 62. The slider 9 is then slid onto the guide 6 in an alignment which can be seen in the illustration of FIG. 9. A catch element 18 which is formed on the slider 9 and can be seen in FIG. 5 comes to rest at one end of the first spring element 8 arranged in the receptacle 7 when the slider 9 is pushed onto the guide 6. At its other end, the first spring element 8 is supported on the boundary wall 71 of the receptacle 7. By displacing the slider 9 along the guide 6, the first spring element 8 is compressed and brought into a preloaded position. The slider 9 is displaced in this case until the latching lugs 10 formed on the guide rails 61, 62 engage in the recesses 11 formed on the slider 9 and the slider 9 latches in a latching position.

With the slider 9 in the latching position, the housing 20 can now be attached to the support rail 3 by means of the attachment elements 5. In this initial position, the housing 20 is displaceable along the support rail and alignable. This state is shown in FIG. 6. In this case, it is particularly clear that in the initial position, the edge 12, due to its shorter length L1, is already coming to lie behind the lower free edge 32 of the support rail, while the edge 13, due to its greater length L2, rests against the lower free edge 32 on the side thereof facing the user.

Figure 8:
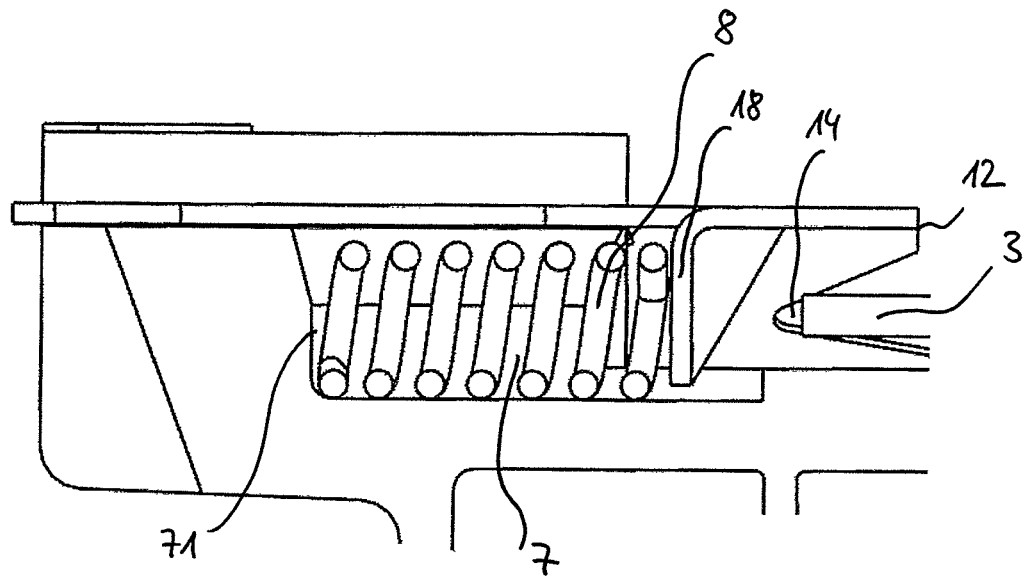
FIG. 8: a further sectional view of the state shown in FIG. 7, in which the first spring element is visible.
Figure 9:
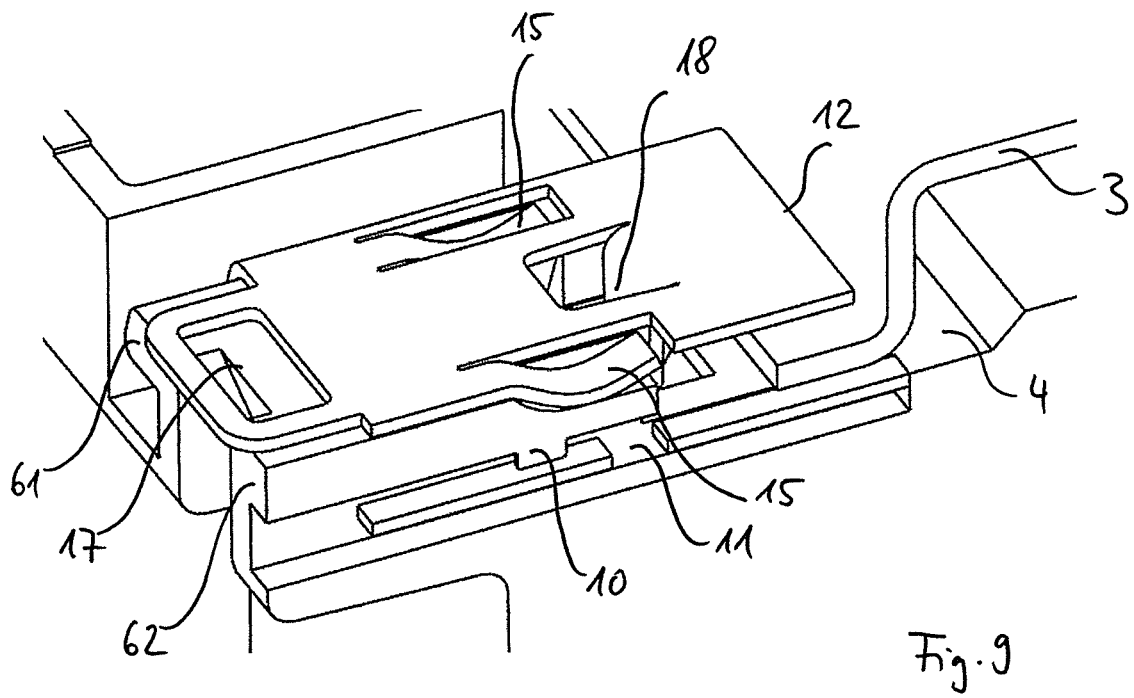
FIG. 9: the state shown in FIG. 7 in a perspective view obliquely from above.

As soon as the desired mounting position is established, an application of force to the mounting plate 4 in the direction of the support rail 3 according to the arrow F in FIG. 6 and against the force of the second spring elements 15 can induce a triggering movement of the slider 9 by means of which the engagement between the latching lugs 10 and the recesses 11 is released and the slider 9 is brought from the latching position into a locking position by means of the restoring force of the first spring element 8. In this locking position, the slider 9 comes to rest against the support rail 3 in a clamping manner in the region of the clamping groove 14 and the support rail fastening means 1 is fixed to the support rail 3 in a locking position. This locking position of the support rail fastening means 1 is shown in FIGS. 7 to 9. It can be seen that the latching lugs 10 are no longer in engagement with the recesses 11 and that the slider 9 abuts in the region of its clamping groove 14 against the lower free edge 32 of the support rail 3 in a clamping manner. The first spring element 8 (cf. FIG. 8) is still also in a preloaded position in the locking position of the support rail fastening means 1 and the remaining restoring force of the first spring element 8 brings about the clamping action of the slider 9 on the support rail 3. The second spring elements 15 come to lie in the locking position of the slider 9 in recesses 150 formed in the guide 6.

The triggering movement is a tilting movement of the slider 9. As already explained above, the second edge 13 of the slider 9 comes to rest against the lower free edge 32 of the support rail 3 in the initial position in such a way that the action of force on the mounting plate 4 in the direction of the support rail 3 is transmitted via the second edge 13 to the slider 9 in such a way that the latter performs a small tilting movement toward the mounting plate 4. In order to facilitate this tilting movement, the mounting plate 4 has recesses 40 (cf. FIGS. 2 and 3) which the side legs 91, 92 can enter during the tilting movement. Due to the tilting movement of the slider 9, the latching lugs 10 detach from the recesses 11 and the slider 9 moves rapidly toward the lower free edge 32 of the support rail 3 due to the restoring force of the first spring element 8. Here, it comes to rest in a clamping manner in the region of its clamping groove 14 and assumes a second stable position, the locking position. The clamping effect is in this case achieved by the still remaining restoring force of the first spring element 8 since the first spring element 8 is designed such that it still has a sufficient preloading even in the locking position. In this respect, the figures are simplified, schematic representations in that the tilting movement, which is completed during the transition from the latching position into the locking position of the slider 9, cannot be seen in them.

In the locking position of the slider 9, the support rail fastening means 1 and thus the housing 20 is fixed to the support rail 3 in such a way that it can neither be removed in a forward direction from the support rail 3 nor be displaced along the support rail 3 without a greater exertion of force. This state is referred to as the locking position of the support rail fastening means 1.

Starting from the locking position of the support rail fastening means 1, the slider 9 can be brought from the locking position back into the latching position again by a movement of the mounting plate 4 or of the housing 20 in a direction which enables the attachment element 5 to be lifted from the support rail 3 (in other words, as shown in FIG. 1, in a vertically upward direction) and the support rail fastening means 1 can be brought back into the initial position in this way. This movement results in a relative movement between the slider 9, which is still resting with its clamping groove 14 on the support rail 3, and the guide 6, which is connected to the mounting plate 4, against the restoring force of the first spring element 8. The latter is compressed more strongly again, namely up to the point at which the latching lugs 10 formed on the guide 6 re-latch in the recesses 11 formed on the slider 9. As soon as the latching lugs 10 and recesses 11 are in mutual engagement, the slider 9 is again in its first stable position, the latching position. The support rail fastening means 1 and the component 2 connected thereto can now be easily removed from the support rail 3. In this way, it is also possible to dismount a fastened component 2 from the support rail 3 without using tools and doing so comfortably from the front, without a user having to awkwardly grasp behind the component in order to release the locking.

Figure 10:
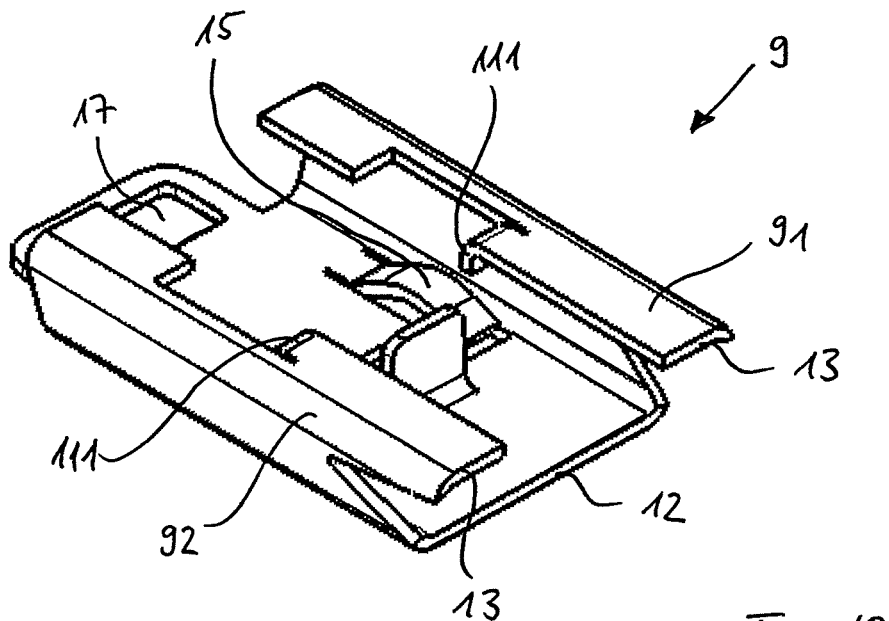
FIG. 10: a second exemplary embodiment of a slider of a support rail fastening means according to the invention in a perspective view from below.
Figure 11:
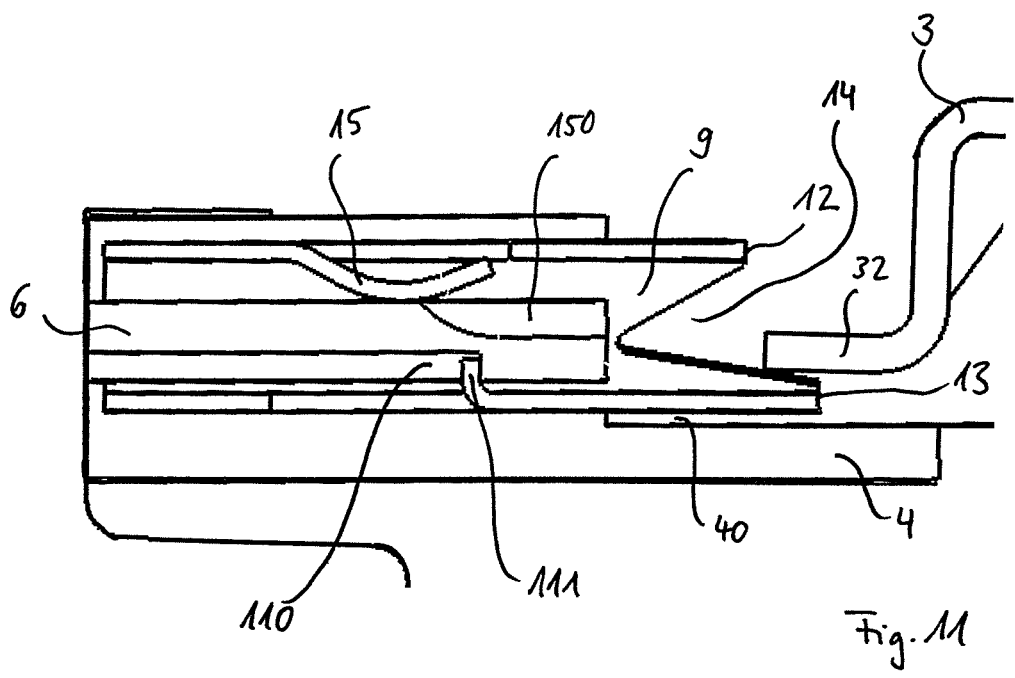
FIG. 11: the slider from FIG. 10 in the latching position in a sectional view.

FIG. 10 shows an alternative exemplary embodiment of a slider 9 in a perspective view from below. The slider 9 shown in FIG. 10 differs from the slider 9 shown in FIGS. 4 and 5 only in that the latching elements do not take the form of recesses but rather of latching hooks 111. When a slider 9 according to FIG. 10 is used, the latching elements on the guide 6 are to be adapted in such a way that the latching hooks 111 can be brought into engagement with the latching elements formed on the guide 6. In this case, the latching elements on the guide 6 are preferably designed as elongated holes 110 in which the latching hooks 111 engage in the latching position of the slider 9, which is shown in FIG. 11.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A support rail fastener for detachably fastening a component to a support rail, comprising:
 a mounting plate, the mounting plate having at least one attachment element and a guide;
 a first spring element; and
 a slider, the slider being displaceable on the guide, the first spring element being configured to be brought into a preloaded position by moving the slider on the guide,
 wherein on the guide and on the slide latching elements are respectively provided which, when the first spring element is preloaded the latching elements are configured to be brought into engagement with each other such that the slider engages in a latching position,
 wherein the support rail fastener in an initial position in which the slider is in the latching position and in which the mounting plate is placed on the support rail by the attachment element is movable along the support rail,
 wherein the slider has a first edge and a second edge at a distance therefrom, and a clamping groove formed between the first edge and the second edge,
 wherein starting from the initial position, a triggering movement of the slider is induceable by application of a force to the mounting plate in a direction of the support rail, as a result of which triggering movement the engagement between the latching elements is released and the slider is configured to be brought by the restoring force of the first spring element from the latching position into a locking position in which the slider in a region of the clamping groove comes into clamping contact with the support rail and the support rail fastener is fixed in a locking position on the support rail,
 wherein the triggering movement comprises a tilting movement of the slider,
 wherein the second edge of the slider in the initial position comes into contact with the support rail such that the force applied to the mounting plate in the direction of the support rail is transferred via the second edge to the slider such that the slider makes a tilting movement,
 wherein the slider, starting from the locking position of the support rail fastener, is transferrable from the locking position back into the latching position by a movement of the mounting plate in a direction which enables the attachment element to be lifted off the support rail, and
 wherein the support rail fastener is configured to be brought back into the initial position in this way.

2. The support rail fastening means according to claim 1, wherein the first spring element is integrally formed with the slider.

3. The support rail fastener according to claim 1,
 wherein the latching elements on the guide comprise latching lugs, and
  wherein the latching elements on the slider comprise corresponding recesses in which the latching lugs engage in the latching position.

4. The support rail fastener according to claim 1, wherein the latching elements on the guide comprise elongated holes, and
 wherein the latching elements on the slider comprise latching hooks which engage in the elongated holes in the latching position.

5. The support rail fastener according to claim 1, wherein the slider comprises at least one second spring element, and
 wherein the triggering movement of the slider is induceable by an action of force on the mounting plate in the direction of the support rail and against a force of the at least one second spring element.

6. The support rail fastener according to claim 5, wherein the slider comprises two second spring elements.

7. The support rail fastener according to claim 5, wherein the at least one second spring element is formed integrally with the slider.

8. The support rail fastener according to claim 5, wherein the at least one second spring element comprises a leaf spring.

9. The support rail fastener according to claim 1, wherein the first spring element comprises a helical spring.

10. The support rail fastener according to claim 1, wherein the guide comprises two guide rails which form a receptacle for the first spring element between them.

11. The support rail fastener according to claim 1, wherein the slider comprises a spring steel.

12. The support rail fastener according to claim 1, wherein the slider comprises an opening for insertion of a tool.

13. The support rail fastener according to claim 1, wherein the mounting plate forms a wall of a housing for receiving the component to be fastened.

\* \* \* \* \*